(12) United States Patent
Kropp

(10) Patent No.: US 6,991,381 B2
(45) Date of Patent: Jan. 31, 2006

(54) EMISSION MODULE FOR AN OPTICAL SIGNAL TRANSMISSION

(75) Inventor: Jörg-Reinhardt Kropp, Berlin (DE)

(73) Assignee: Infineon Technologies AG, Munich (DE)

(*) Notice: Subject to any disclaimer, the term of this patent is extended or adjusted under 35 U.S.C. 154(b) by 40 days.

(21) Appl. No.: 10/475,131

(22) PCT Filed: Apr. 18, 2001

(86) PCT No.: PCT/DE01/01538

§ 371 (c)(1),
(2), (4) Date: Oct. 17, 2003

(87) PCT Pub. No.: WO02/084358

PCT Pub. Date: Oct. 24, 2002

(65) Prior Publication Data

US 2004/0136658 A1    Jul. 15, 2004

(51) Int. Cl.
G02B 6/36    (2006.01)

(52) U.S. Cl. .................... 385/88; 385/92; 385/93
(58) Field of Classification Search ............ 385/14, 385/88; 372/79–103
See application file for complete search history.

(56) References Cited

U.S. PATENT DOCUMENTS

| 4,433,898 A | | 2/1984 | Nasiri | |
|---|---|---|---|---|
| 4,989,051 A | * | 1/1991 | Whitehead et al. | 257/80 |
| 5,101,465 A | * | 3/1992 | Murphy | 385/88 |
| 5,132,982 A | | 7/1992 | Chan et al. | |
| 5,606,572 A | * | 2/1997 | Swirhun et al. | 372/96 |
| 5,821,530 A | * | 10/1998 | Lefevre et al. | 250/227.24 |
| 5,925,898 A | * | 7/1999 | Spath | 257/98 |
| 5,943,357 A | | 8/1999 | Lebby et al. | |
| 6,005,262 A | * | 12/1999 | Cunningham et al. | 257/84 |

FOREIGN PATENT DOCUMENTS

| DE | 195 27 026 C2 | 2/1997 |
|---|---|---|
| JP | 56006482 | 1/1981 |

OTHER PUBLICATIONS

Copy of the International Search Report, International Application No. PCT/DE01/01538, International Filing Date Apr. 18, 2001, 6 pgs.

* cited by examiner

Primary Examiner—Brian Healy
Assistant Examiner—Derek L. Dupuis
(74) Attorney, Agent, or Firm—Eschweiler & Associates, LLC

(57) ABSTRACT

The invention relates to an emission module for an optical signal transmission, comprising an emission unit which emits light of a certain wavelength, an emission unit substrate on which the emission unit is arranged or embodied, a detection unit which detects light of a certain wavelength, and a detection unit substrate on which the detection unit is arranged or embodied. According to the invention, the emission unit substrate and/or the detection unit substrate are transparent to the wavelength emitted by the emission unit, and the emission unit and the detection unit are superposed in the direction of the light emitted. The inventive solution enables the emission unit and the detection unit to be optically coupled without requiring additional optical components such as reflecting surfaces. Novel, compact optical system can thus be carried out in an emission module.

18 Claims, 4 Drawing Sheets

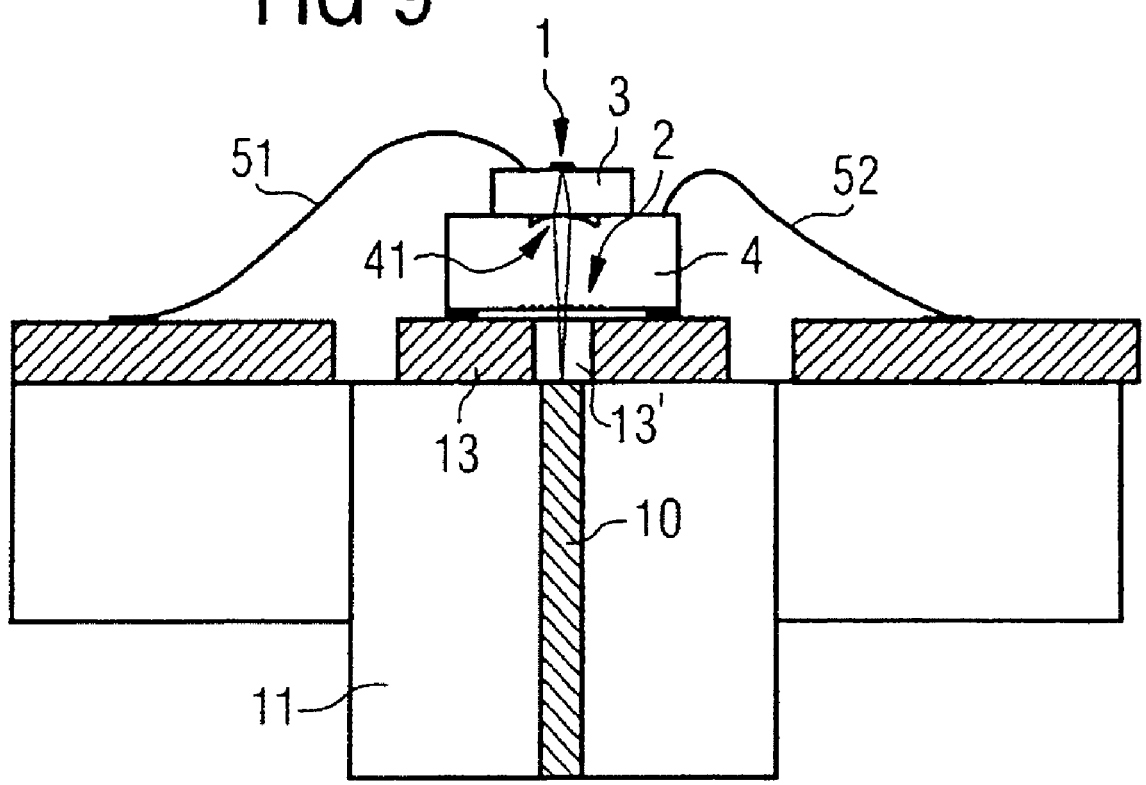

EMISSION MODULE FOR AN OPTICAL SIGNAL TRANSMISSION

RELATED APPLICATION

This application claims priority to International Application No. PCT/DE01/01538 filed Apr. 18, 2001, which is entitled "Emission Module for an Optical Signal Transmission", which was not published in English.

FIELD OF THE INVENTION

The invention relates to emission modules for an optical signal transmission

BACKGROUND OF THE INVENTION

Emission modules for an optical signal transmission are known in which a laser diode is assigned a monitor photodiode which detects a part of the light emitted by the laser diode and serves for monitoring the laser diode. In particular, it is known, in order to realize a monitor function in VCSEL (Vertical Cavity Surface Emitting Laser) laser diodes, in which the resonator is situated vertically on the surface of a chip, to use reflective areas which project a part of the laser light onto a monitor diode. In this case, the laser diode may also be positioned on the monitor diode itself.

Furthermore, bidirectional emission/reception modules are known which, for the bidirectional transmission of data, simultaneously couple optical radiation into a waveguide and detect light power guided in the waveguide. Beam splitters with wave-selective filters and also a lens coupling optical arrangement are used for decoupling the emission device and the reception device in an emission/reception module of this type.

U.S. Pat. No. 6,005,262 discloses an arrangement in which a vertically emitting laser (VCSEL) is arranged in a flip-chip arrangement directly on a CMOS circuit. The CMOS circuit has a detector which detects a part of the laser light which is emitted at the rear side.

SUMMARY OF THE INVENTION

The present invention is based on the object of providing emission modules having an emission device and detection device which are distinguished by a simple and compact arrangement of emission and detection device.

This object is achieved according to the invention by means of an emission module having the features of claim 1 and an emission module having the features of claim 2. Preferred and advantageous refinements of the invention are specified in the subclaims.

Accordingly, the invention in a first variant of the invention is distinguished by the fact that
 the emission device substrate and the detection device substrate are transparent to the wavelength emitted by the emission device,
 the emission device substrate with the emission device and the detection device substrate with the detection device are arranged one above (optically in series) the other with regard to the direction of the emitted light, and
 the light which falls onto the detection device has previously passed through the emission device substrate and the detection device substrate, the emission device and the detection device being arranged at sides of the emission device substrate and of the detection device substrate which are remote from one another.

Emission and reception device are thus arranged at sides of the respective substrate which are remote from one another and the emitted light traverses both the emission device substrate and the detection device substrate before it falls onto the detection device.

A second embodiment variant of the present invention is distinguished by the fact that,
 the emission device substrate and/or the detection device substrate is transparent to the wavelength emitted by the emission device,
 the emission device substrate with the emission device and the detection device substrate with the detection device are arranged one above the other (optically in series) with regard to the direction of the emitted light, and
 the light which is coupled into the optical waveguide has previously passed through the emission device substrate or the detection device substrate, the emission device and the detection device being arranged at sides of the emission device substrate and of the detection device substrate which face one another and in a manner situated directly opposite in this case.

Emission and reception device are in this case arranged at sides of the respective substrate which face one another in a manner situated directly opposite and the emitted light traverses either the emission device substrate or the detection device substrate before it is coupled into an optical waveguide.

The light emitted by the emission device can radiate through the substrate of the emission device and/or the substrate of the photodiode, so that emission device and detection device can be arranged one above or below the other, without the beam path of the emission module being interrupted by the respective substrate. As a result of this, an optical coupling of emission device and detection device is possible without the need for additional optical components such as reflective areas.

A substrate is to be regarded as transparent to light of a specific wavelength in the sense of the invention if it does not completely absorb light of said wavelength. Preferably, just slight absorption of the transmitted light of less than 20 dB/mm is present.

In one preferred refinement of the invention, the light emitted by the emission device radiates through the detection device before being coupled into an optical waveguide, i.e. said detection device is arranged between the emission device and an optical waveguide or a coupling optical arrangement. In this case, the emission device emits light in precisely one direction. In this refinement, the detection device is designed in such a way that it absorbs only a small part of the radiation and converts it into an electrical signal, for example a few percent of the light. By contrast, the majority of the light emitted by the emission device radiates through the detection device substrate, which is transparent in this embodiment.

This arrangement has the advantage that the light which is emitted by the emission device and is utilized for data transmission purposes also radiates directly through the detection device, as a result of which a monitoring of the emission device is achieved in a simple manner.

In a further preferred refinement of the invention, the emission device emits light in two opposite directions. For this purpose, by way of example, light emerges from the two sides of a VCSEL substrate. In this case, the light emitted in one direction is coupled into an optical waveguide, while the light emitted in the other direction falls onto the detection device. The percentage of light which [lacuna] coupled into the optical waveguide or which falls onto the detection device can be set through the degree of mirror-coating of the two mirrors of the laser diode.

In this refinement, either the light provided for detection or the light provided for coupling into an optical waveguide radiates through the substrate of the emission device. On account of the transparent properties of the substrate, the detection device or an optical waveguide to be coupled may directly adjoin the emission device or the substrate of the emission device.

In a preferred refinement of the invention, the emission device—particularly in a chip-on-chip arrangement—is arranged directly on or under the detection device. For this purpose, provision is made, by way of example, for adhesively bonding the emission device directly onto the detection device by means of a transparent adhesive or for applying the emission device on the detection device by soldering or a bump method. In this case, the optically active region of the emission device is situated on the upper side in accordance with one variant of the invention and on the lower side of the emission device substrate in accordance with the other variant of the invention and in this case directly opposite the optically active region of the detection device.

A gap possibly present between the emission device and the detection device is preferably filled by an optically transparent potting compound. This has the advantage that the region of the optical path between emission device and detection device is encapsulated and protected against dirt and ambient influences.

In a preferred refinement of the second variant of the invention in accordance with claim 2, emission device and detection device are contact-connected in such a way that an electrical terminal of the emission device and an electrical terminal of the detection device are connected together, so that only one bonding wire is necessary for these two terminals.

In an advantageous development of the invention, the arrangement of emission device and detection device is mounted directly above an optical waveguide. For this purpose, it is preferably provided that the optical waveguide is guided via a guide as far as the surface of the emission device substrate or of the detection device substrate and is fixed with regard thereto. For this purpose, the arrangement of emission device and detection device will be mounted for example directly on the end face of a ceramic pin which centrally accommodates the optical waveguide. The end face may be metalized in this case in order to be able simultaneously to provide a contact connection of the emission device and/or of the reception device.

In a preferred embodiment, the emission device is mounted with its optically active region facing up directly above the optical waveguide. In this case, the detection device is arranged on that side of the emission device which is remote from the optical waveguide. In this case, the emission device emits light in two opposite directions.

The detection unit is mounted directly above the optical waveguide, the emission device is situated on that side of the detection device which is remote from the optical waveguide, the emission device in this refinement emitting light only in one direction.

The arrangement of emission device and monitor device is preferably mounted on a leadframe. In this case, the leadframe has a cutout in order to allow an optical coupling to an optical waveguide. The arrangement of emission device and detection device on a leadframe is particularly advantageous since the mounting of chips on a leadframe constitutes a standard technique and can be realized in a simple manner in terms of production engineering. In this case, it is possible to have recourse to the known production and mounting methods.

In an advantageous development of the invention, light-shaping elements, in particular a lens, for instance in the form of a microcalotte or in the form of a Fresnel lens, are integrated into the emission device substrate and/or the monitor device substrate. This simplifies a coupling of light into an optical waveguide assigned to the emission device.

In the preferred refinement of the invention, the emission device comprises a VCSEL laser diode which emits light in the vertical direction with regard to the surface of the emission device substrate. On account of the emission device substrate being formed in transparent fashion, it is also possible in this case for light to be emitted in the opposite direction, likewise vertical with regard to the substrate surface. In this case, the two mirrors of the laser resonator are formed as partly transmissive mirrors. The degrees of reflection are, for example, 99.91% for one mirror and 99.95% for the other mirror.

The detection unit preferably comprises a photodiode.

In a first variant of the invention, the detection device detects a part of the light emitted by the emission device and thus serves as a monitor device for monitoring the emission device. In a second, alternative variant, the detection device detects light of a wavelength which differs from the wavelength of the light emitted by the emission device. By contrast, the photodiode is insensitive to the wavelength of the light emitted by the emission device. A configuration of this type affords the possibility of a bidirectional data transmission on a waveguide with different wavelengths in each direction. In this case, this bidirectional data transmission is effected by means of an extremely compact arrangement of the emission and detection device arranged one above the other.

The emission device preferably emits light of a wavelength which lies above 950 nm and is preferably either of the wavelengths 1300 nm and 1500 nm, which are of particular interest for an optical data transmission. However, it may also be provided that the emission device emits light of a wavelength of less than 950 nm, in particular of 850 nm.

GaAs, for example is used as the substrate which is transparent to the light of the emission device, said GaAs being transparent to wavelengths of above 950 nm. However, it is also possible to use other materials for the substrate of the emission device or of the detection device, in particular also silicon or a sapphire substrate. In this case, recourse is had to methods in which a laser diode or a monitor diode is produced on a first substrate and then transferred to another substrate such as silicon, for example. Methods of this type are known per se.

The invention is explained in more detail below using a plurality of exemplary embodiments with reference to the figures of the drawing, in which:

FIG. 9 shows an exemplary embodiment of an emission module according to the invention, which represents an alternative configuration of the exemplary embodiment of FIG. 8.

All the illustrations are diagrammatic and do not necessarily reproduce the actual relative sizes.

DETAILED DESCRIPTION OF THE INVENTION

Figure 1:
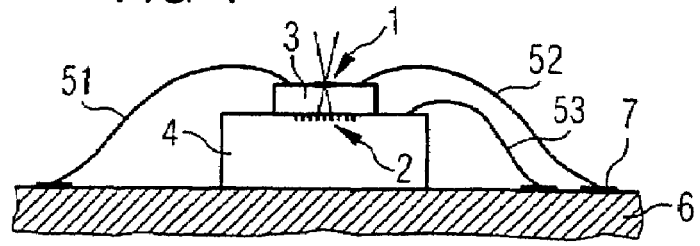
FIG. 1 shows a first exemplary embodiment of an emission module according to the invention, in which a laser diode is arranged above a photodiode.

FIG. 1 shows an emission module according to the invention with an emission device 1 and a detection device 2, which are arranged on a leadframe or a printed circuit board 6. The emission device is preferably a VCSEL laser diode 1, the VCSEL structure of which is applied epitaxially in the vertical direction to a chip or a substrate 3. However, it likewise lies within the scope of the invention for the VCSEL structure to be produced on another substrate, to be removed from this substrate and then to be mounted onto the substrate 3.

The detection device is a photodiode 2 placed onto, or integrated into, a substrate 4. In the exemplary embodiment illustrated, it serves as a monitor diode and, for this purpose, is connected to a control/regulating device (not illustrated) for regulating the output power of the laser diode 1.

The substrate 3, on which the VCSEL laser diode 1 is arranged, is transparent to the light wavelength emitted by the laser diode 1. Therefore, it is possible that light emerging from both sides of the resonator of the VSCEL laser diode 1, said resonator being arranged vertically on the substrate 3, is also emitted in both directions, the light emerging downward from the resonator firstly radiating through the substrate 3 and then emerging from the substrate 3. In this case, the percentage of light which is emitted upward by the laser diode 1 and the percentage of light which is emitted downward by the laser diode 1 is set by the degree of mirror-coating of the lower and upper mirrors of the resonator of the laser diode 1.

In concrete terms, in FIG. 1, the photodiode 2 is mounted with the optically active region facing up (upside up) onto the carrier substrate 4 arranged on the printed circuit board 6. The substrate 3 with the laser diode 1 is mounted directly onto the photodiode 2, to be precise by means of an optically transparent adhesive in the exemplary embodiment illustrated. On account of the transparency of the substrate 3, the light emitted downward by the laser diode 1 is radiated directly onto the photodiode 2.

In the exemplary embodiment illustrated, electrical contact is made with the laser diode 1 from the topside by means of two bonding wires 51, 52, which lead to contact pads 7 on the printed circuit board 7. Contact is made with the photodiode 2 from the topside by means of a bonding wire 53 and from the underside by means of soldering or adhesive bonding with a conductive adhesive (not illustrated).

The light emitted upward by the laser diode 1 can be coupled into an optical waveguide (not illustrated) directly or via an additional optical arrangement.

The laser diode 1 preferably emits light of a wavelength above 950 nm, in particular light of a wavelength of 1300 or 1500 nm. The substrate 3 of the laser diode 1 is composed of GaAs, for example, which is light-transmissive for light having wavelengths above 950 nm. As an alternative, the substrate 3 is a silicon or sapphire substrate for example. Silicon is transparent to wavelengths above about 1100 nm. Sapphire is also transparent to wavelengths below 950 nm, in particular to wavelengths of 850 nm. The VCSEL laser 1 then emits light of a wavelength of 850 nm for example, and, in terms of production engineering, is firstly produced on another substrate and then separated from the latter and transferred to the sapphire substrate. Transferring the laser diode 1 to a new substrate in this way means that it is possible to use substrates 3 having desired optical properties.

Figure 2:
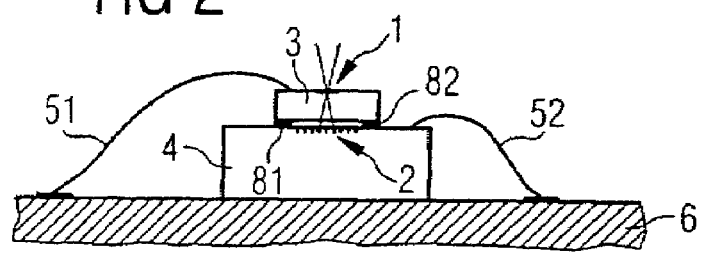
FIG. 2 shows a second exemplary embodiment of an emission module according to the invention, in which a laser diode is arranged above a photodiode.

The exemplary embodiment of FIG. 2 differs from the exemplary embodiment of FIG. 1 firstly in that the VCSEL laser diode 1 is applied to the photodiode 2 by means of soldering bumps 81, 82 rather than an adhesive. Instead of by means of soldering bumps 81, 82, a contact connection may also be effected for example by means of a conductive adhesive or other selective electrical connections between the photodiode chip and the substrate 3. The optically sensitive region of the photodiode 2 is left free for passage of radiation in this case. The resulting gap between the photodiode 2 and the substrate 3 is preferably filled with an optically transparent potting compound.

The other difference with respect to the exemplary embodiment of FIG. 1 is that the second electrical contact of the laser diode 1 is situated on the rear side of the substrate 3, a contact of the laser diode 1 and a contact of the monitor diode 2 being connected together and contact-connected via a bonding wire 52.

Figure 3:
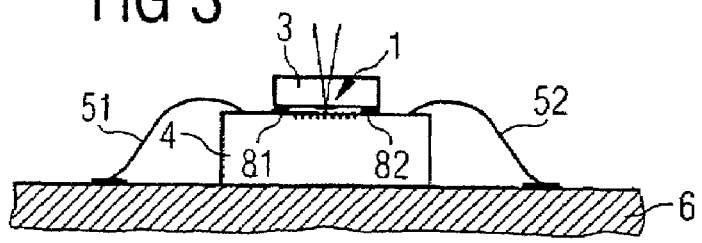
FIG. 3 shows a third exemplary embodiment of an emission module according to the invention, in which a laser diode is arranged above a photodiode.

In the exemplary embodiment of FIG. 3, the laser diode 1 is mounted with the optically active region facing down (upside down) by means of soldering bumps 81, 82 on the photodiode 2 or the photodiode substrate 4. Consequently, in this exemplary embodiment, the proportion of light emitted through the substrate 3 from the laser diode 1 is utilized for a data transmission, whereas the directly emitted light falls onto the photodiode 2 arranged directly underneath. Electrical contact is made with the laser diode 1 of the arrangement by means of two bonding wires 51, 52, one of the terminals being connected together with a terminal of the photodiode 2 as in FIG. 2.

Figure 4:
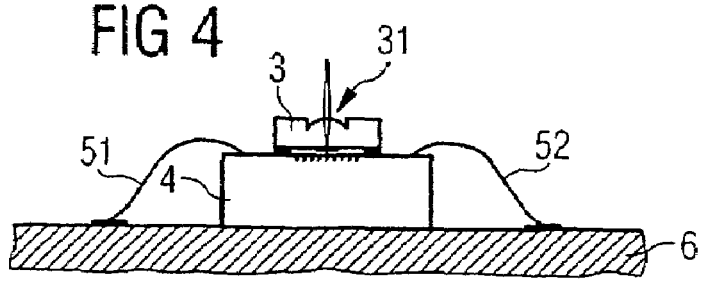
FIG. 4 shows an alternative configuration of the exemplary embodiment of FIG. 3, in which a lens is additionally integrated into the substrate of the laser diode.

In the exemplary embodiment of FIG. 4, a microcalotte as lens 31 is integrated into the substrate 3 at that side of the substrate 3 which is remote from the active VCSEL region. This focuses the light to be coupled into an optical waveguide.

Figure 5:
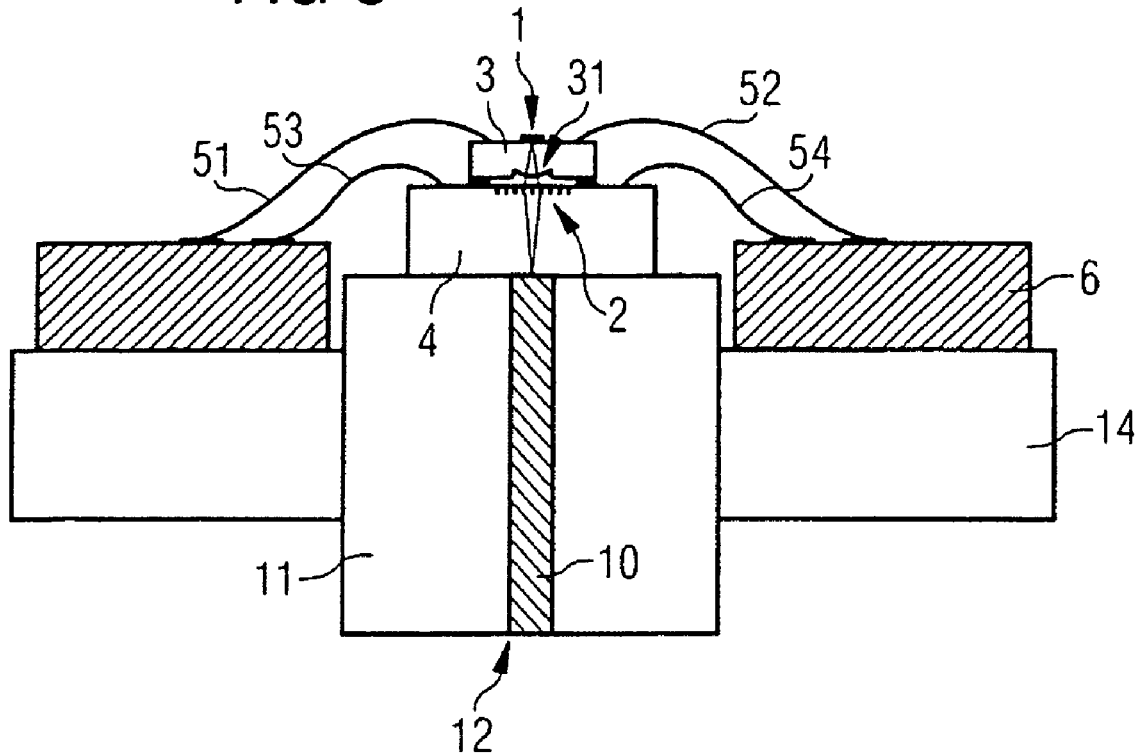
FIG. 5 shows a fourth exemplary embodiment of an emission module according to the invention, in which a sandwich arrangement of a laser diode and a photodiode is arranged directly above a waveguide.

FIG. 5 shows a further exemplary embodiment of the invention, in which a sandwich arrangement of laser diode 1 and photodiode 2 (corresponding to the arrangement of FIG. 2) is mounted directly above a waveguide 10. The waveguide 10 is situated in a fine hole 12 in a ferrule 11. Instead of using a ferrule, it may also be provided that the waveguide runs in a substrate, in particular in a ceramic substrate, and is guided as far as one surface of the substrate and fixed there.

The arrangement of laser diode 1 and photodiode 2 is fixed directly on the end face of the ferrule 11. For this purpose, the photodiode substrate 4 is adhesively bonded directly onto the end face of the ferrule.

The photodiode 2 and the laser diode 1 have their two electrical contacts in each case on the topside and are contact-connected by bonding wires 51, 52, 53, 54 leading to contact pads 7 on a printed circuit board 6. In this case, the printed circuit board 6 has a cutout in the region of the ferrule 11. A holder 14 serves as holder for the ferrule 11 and/or as carrier for the printed circuit board 6.

On the side remote from the laser diode 1, the laser diode substrate 3 has, as beam-shaping element, a lens 31 in the form of a microcallote, which has the effect that the light emitted by the laser diode 2 is coupled to the waveguide 10 with a high degree of coupling.

In the exemplary embodiment of FIG. 5, the light generated by the laser diode 1 radiates firstly through the laser diode substrate 3 and secondly through the photodiode 2 and the photodiode substrate 4. The light is coupled through the photodiode substrate 4 into the optical waveguide 10 arranged directly below the photodiode chip 4.

Provided that the photodiode 2 in this case detects the same wavelength which is emitted by the laser diode 1, it is used as a monitor diode for the emitted light. However, it is likewise possible to design the photodiode 2 in such a way that it is not sensitive to the wavelength of the laser diode 1, but rather is sensitive to a different wavelength lying above or below the laser wavelength. The detection device or photodiode 2 can then be used as a detection unit of a bidirectional emission/reception module, which detection unit detects light of a second wavelength that is coupled out from the optical waveguide 10, while the laser diode 1 couples light of a first wavelength into the optical waveguide 10.

A compact arrangement for the bidirectional transmission of data on a waveguide 10 with two different wavelengths is provided for this case. By arranging further emission and reception devices with transparent substrates one after the other, it is possible to use further wavelengths for a bidirectional data transmission.

Figure 6:
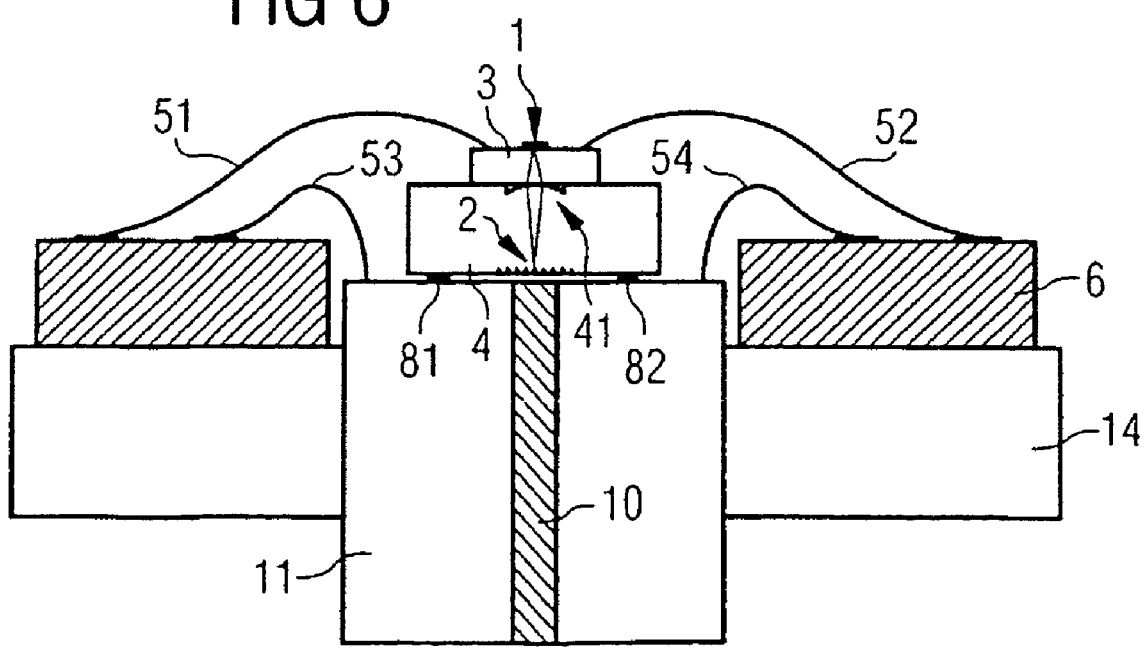
FIG. 6 shows a fifth exemplary embodiment of an emission module according to the invention, in which a sandwich arrangement of a laser diode and a photodiode is arranged directly above a waveguide.

In the exemplary embodiment of FIG. 6, a focusing lens 41 is formed in the substrate 4 of the photodiode 2 rather than in the laser diode substrate 3. Furthermore, in comparison with the arrangement of FIG. 1, the photodiode is fixed with the optically active region facing down (upside down) on the end side of the ferrule 11. In this case, the end side of the ferrule 11 is metalized and electrical contact is made with the photodiode 2 by means of soldering bumps 81, 82 arranged on the end side of the ferrule 11. For the rest, the arrangement corresponds to the arrangement of FIG. 5.

Figure 7:
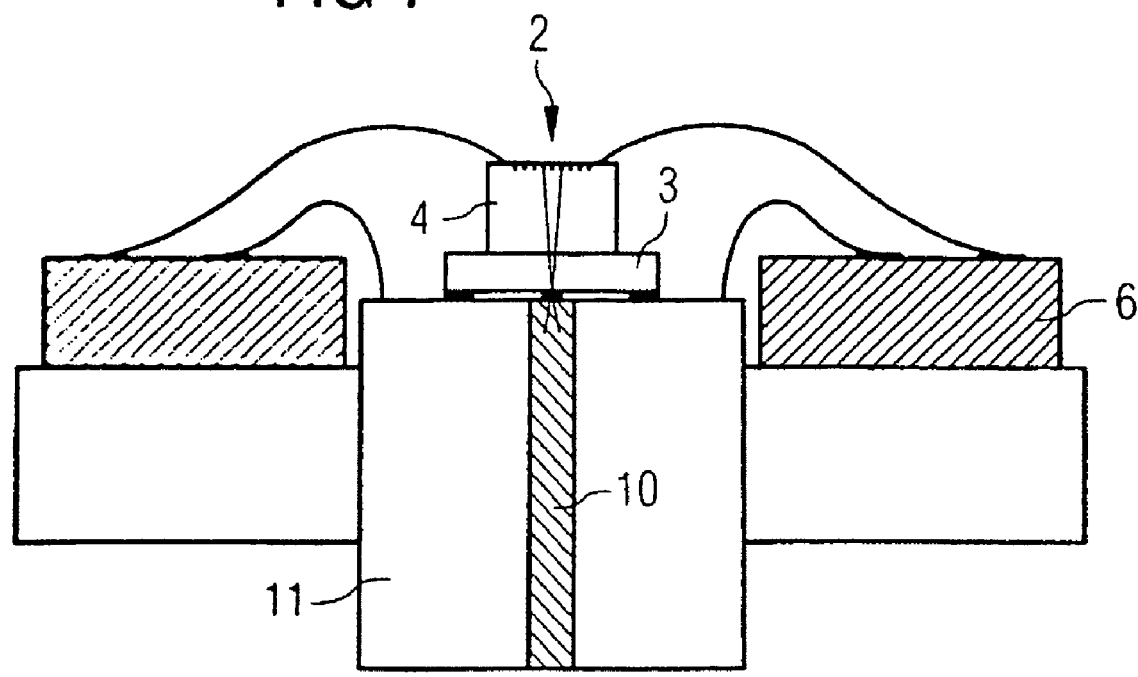
FIG. 7 shows a sixth exemplary embodiment of an emission module according to the invention, in which a sandwich arrangement of a laser diode and a photodiode is arranged directly above a waveguide.

In the embodiment of FIG. 7, the laser diode 1 is guided with the optically active region facing down (upside down) by means of soldering bumps 81, 82 on the end side of the substrate (ferrule 11) guiding the optical waveguide 10. In this case, the light emitted downward is coupled directly into the waveguide 10. The light emitted upward passes through the substrates 3, 4 for the laser diode 1 and the photodiode 2, said substrates being optically transparent to the laser light. The electrical contact connection is effected analogously to the electronic contact connection in the exemplary embodiment of FIG. 6. Furthermore, it is also pointed out that the substrate 4 with the photodiode 2 is preferably mounted on the rear side of the substrate 3 of the laser diode 1 by means of an optically transparent adhesive.

In an alternative configuration of the exemplary embodiment of FIG. 7 (not illustrated), the laser chip 3 is turned over, so that the laser diode 1 [lacuna] arranged on the topside of the substrate 3. Contact is then made with the laser chip likewise from the top side by means of two bonding wires which are guided from the printed circuit board 6 or a leadframe to the topside of the laser diode 1 in accordance with FIG. 5. This has the advantage over the embodiment of FIG. 7 that the laser diode 1 can already be operated in the course of mounting the arrangement on the substrate 11 and thus be adjusted actively in the course of mounting. In the case of the embodiment of FIG. 7, by contrast, adjustment of laser diode and photodiode requires passive alignment structures in the laser diode substrate and in the photodiode substrate and also in the substrate 11 guiding the optical waveguide 10.

In the preceding exemplary embodiments, in the same way as in the exemplary embodiment of FIG. 2, provision may be made for providing an optically transparent potting compound in the region of the light-shaping elements 31, 41 and/or between the optical waveguide 10 and the adjoining substrate 3, 4. By way of example, in the exemplary embodiment of FIG. 5, provision may be made for filling the region between the lens 31 and the photodiode 2 with a potting compound. In the exemplary embodiment of FIG. 6, provision may be made for filling with a potting compound firstly a region around the lens 41 and secondly the gap between the photodiode 2 and the waveguide 10 or between the substrate 4 and the end side of the ferrule 11. An optically transparent potting compound protects the optical path against dirt and ambient influences. A reduction of the refractive power of the lenses 31, 41 which accompanies the potting can be accepted in this case.

Figure 8:
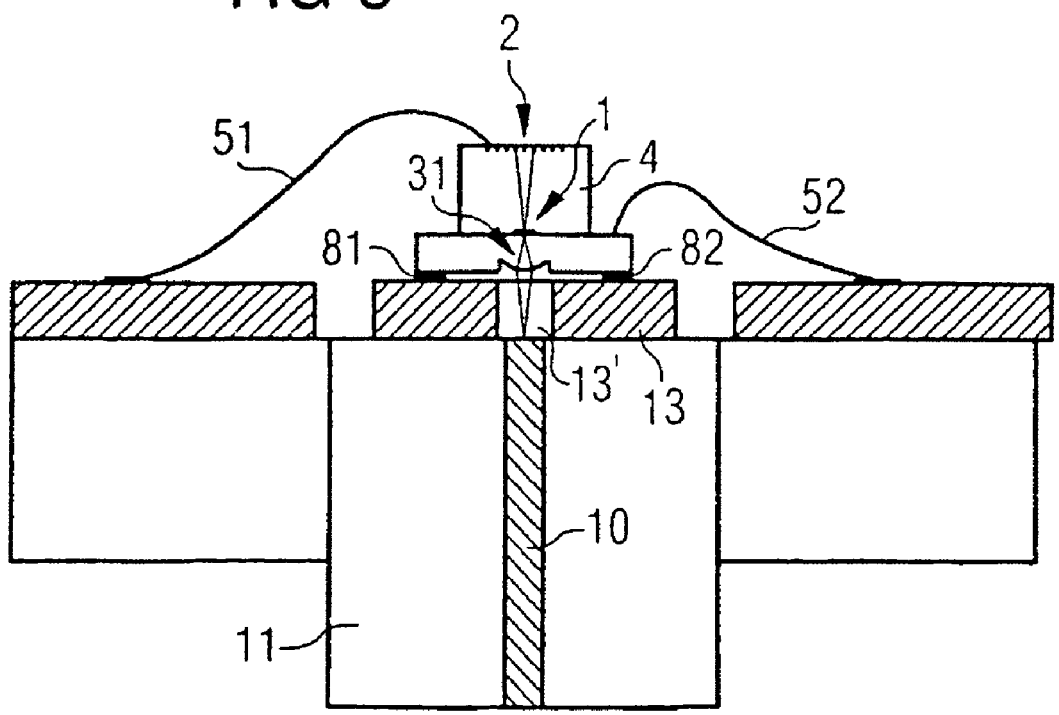
FIG. 8 shows a seventh exemplary embodiment of an emission module according to the invention, in which a sandwich arrangement of a laser diode and a photodiode is mounted on a leadframe having an opening.

In the exemplary embodiment of FIG. 8, the photodiode is arranged upside up, as described with regard to the alternative of FIG. 7 just explained. In this case, the sandwich arrangement of laser diode 1 and photodiode 2 is mounted on a leadframe 13. The leadframe 13 has an opening 13', which allows an optical coupling between the laser diode 1 and the optical waveguide 10. In this case, the substrate 11 (ferrule 11) guiding the optical waveguide 10 is brought directly up to the underside of the leadframe 13. Contact is made with the photodiode 2 and the laser diode 1 firstly by means of bonding wires 51, 52 and secondly by means of soldering pads 81, 82. An active adjustment above the waveguide 10 is possible in a simple manner in this variant of the invention as well.

A lens 31 is once again integrated into the laser diode substrate 3 in order to enable improved coupling of laser light into the optical waveguide 10.

Finally, the exemplary embodiment of FIG. 9 essentially corresponds to the exemplary embodiment of FIG. 8, the laser diode, in accordance with the exemplary embodiment of FIG. 6, being mounted on the photodiode and the latter being mounted on the leadframe 13. Contact is made with the laser diode by means of bonding wires 51, 52 and contact is made with the photodiode 2 by means of soldering bumps 81, 82 placed on current- and signal-carrying contact pads of the leadframe 13.

The embodiment of the invention is not restricted to the exemplary embodiments presented above. All that is essential to the invention is that an emission device substrate and/or a detection device substrate is at least partly transparent to the wavelength emitted by the emission device and the emission device and the detection device are arranged one above the other or one below the other with regard to the direction of the emitted light.

What is claimed is:

1. An emission module for an optical signal transmission, comprising:
   an emission device, which emits light of a specific wavelength,
   an emission device substrate, on which the emission device is arranged,
   a detection device, which detects light of a specific wavelength, and a
   detection device substrate, on which the detection device is arranged or formed,
   the emission device substrate or the detection device substrate being transparent to the wavelength emitted by the emission device,
   the emission device substrate with the emission device and the detection device substrate with the detection device being arranged one above the other with regard to the direction of the emitted light, and
   the light which is coupled into an optical waveguide previously having passed through the emission device substrate or the detection device substrate, the emission device and the detection device being arranged at sides of the emission device substrate and of the detection device substrate which face one another and in a manner situated directly opposite in this case.

2. The emission module as claimed in claim 1 characterized in that an electrical terminal of the emission device and an electrical terminal of the detection device are connected together and jointly contact-connected.

3. The emission module as claimed in claim 1 wherein the light emitted by the emission device radiates through the detection device before being coupled into an optical waveguide.

4. The emission module as claimed in claim 1 wherein the emission device emits light in two opposite directions, the light emitted in one direction being coupled into an optical waveguide and the light emitted in the other direction falling onto the detection device.

5. The emission module as claimed in claim 1 wherein a gap resides between the emission device and the detection device and is filled by an optically transparent potting compound.

6. The emission module as claimed in claim 1 wherein the arrangement of emission device and detection device is mounted directly above an optical waveguide.

7. The emission module as claimed in claim 6 wherein the optical waveguide is guided via a guide in a substrate as far as the surface of the emission device substrate or of the detection device substrate.

8. The emission module as claimed in claim 6 wherein the arrangement of emission device and detection device is mounted directly on the end face of a ceramic pin accommodating the optical waveguide.

9. The emission module as claimed in claim 6 wherein the emission device is mounted directly above the optical waveguide.

10. The emission module as claimed in claim 1 wherein the arrangement of emission device and detection device is mounted on a leadframe, the leadframe having a cutout in order to allow an optical coupling to an optical waveguide.

11. The emission module as claimed in claim 1 further comprising a light-shaping element integrated into the emission device substrate or the detection device substrate.

12. The emission module as claimed in claim 1 wherein the emission device comprises a VCSEL laser.

13. The emission module as claimed in claim 1 wherein the detection device comprises a photodiode.

14. The emission module as claimed in claim 1 wherein the detection device serves as a monitor device and, for this purpose, detects a part of the light from the emission device.

15. The emission module as claimed in claim 1 wherein the detection unit detects light of a wavelength which differs from the wavelength of the light emitted by the emission device, the emission and detection device forming a bidirectional emission/reception module.

16. The emission module as claimed in claim 1 wherein the emission device emits light of a wavelength above 950 nm.

17. The emission module as claimed in claim 1 wherein the emission device substrate or the detection device substrate comprises gallium arsenide.

18. The laser module as claimed in claim 1 wherein the emission device substrate or the detection device substrate comprises silicon or a sapphire material.

* * * * *